April 8, 1969

W. VENEMA 3,437,132

WATER COOLED HEAT SINK

Filed Aug. 30, 1967

INVENTOR.
WILLIAM VENEMA
BY Laurence I. Lerner
ATTORNEY

United States Patent Office 3,437,132
Patented Apr. 8, 1969

3,437,132
WATER COOLED HEAT SINK
William Venema, North Haledon, N.J., assignor to Vemaline Products Company, Inc., Franklin Lakes, N.J., a corporation of New Jersey
Filed Aug. 30, 1967, Ser. No. 664,357
Int. Cl. F28f 7/02
U.S. Cl. 165—80 3 Claims

ABSTRACT OF THE DISCLOSURE

A water cooled heat sink which is formed from an extrusion having at least one passageway therethrough, which passageway is multifaceted along the length thereof to provide additional heat conducting surfaces and which passageway acts as a conduit for water passing through the heat sink to more quickly cool the heat sink.

With the development of larger current capacity semiconductor devices, there has been created a need for heat sinks on which the semiconductors can be mounted which will better conduct the heat from the semiconductor at low cost. When a given power rating for a semiconductor is set for a design, the designer has two alternatives. He can purchase a semiconductor having a higher power rating than required which would need no heat sink during its operation or he can purchase a semiconductor which in combination with a heat sink would have the designed power rating. The additional cost of the heat sink plus the cost of the lower rated semiconductor must be less than the cost of the higher rated semiconductor alone to justify the second alternative. The use of water cooled heat sinks provides a more efficient means of conducting the heat away from the semiconductor and, accordingly, even lower rated and thus cheaper semiconductors can be utilized for certain applications. Thus a heat sink must have the conjoint requirements of thermal conductive efficiency and low cost.

In this regard, the above conjoint requirements are achieved in the present invention by utilizing an extruded heat sink which has formed therein an extruded conduit for the passage of fluid. Further, the extruded conduits are multifaceted along the length of the heat sink so as to provide a larger surface area for the water passing through the conduit to conduct heat from the heat sink and thus more efficiently cool the semi-conductor mounted on the heat sink. Further, the extruded multifaceted passageway is very inexpensive to add as a feature to the heat sink and, accordingly, a better product is provided at little additional cost.

For the purpose of illustrating the invention, there is shown in the drawings forms which are presently preferred; it being understood, however, that this invention is not limited to the precise arrangements and instrumentalities shown.

Figure 1:
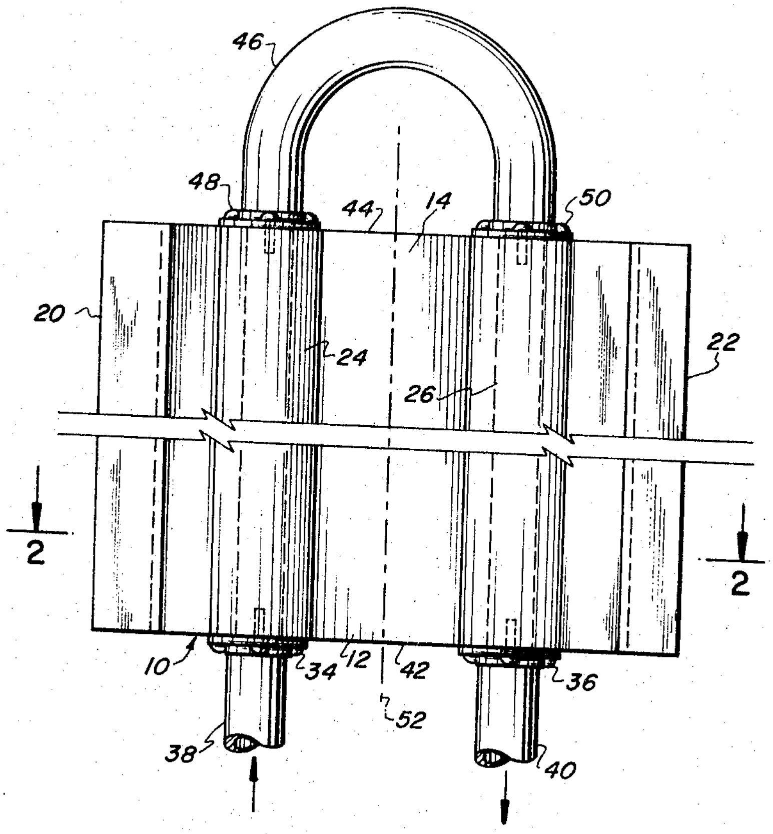
FIGURE 1 is a top plan view of a heat sink built in accordance with the principles of the present invention.
Figure 2:
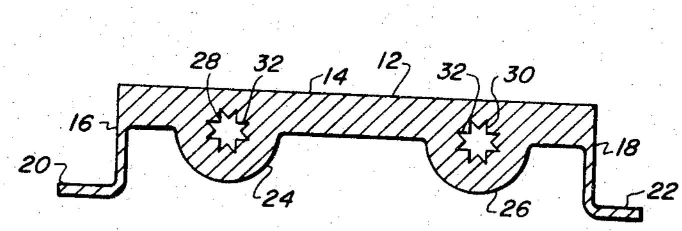
FIGURE 2 is a cross-sectional view of the heat sink of FIGURE 1 taken along lines 2—2.

In FIGURE 1, the heat sink of the present invention is generally designated by the numeral 10. The heat sink 10 comprises an extrusion 12 having a flat planer top portion 14 and downwardly extending legs 16 and 18. At the lower end of the legs 16 and 18 are horizontal flanges 20 and 22 running the length of the extrusion 12. It will be understood that the entire extrusion 12 can be part of a long extruded metal strip which has been cut to the desired length for the particular heat sink. A semiconductor (not shown) is normally fixedly secured to the top surface 14 of the heat sink 10. The central portion of the extrusion 12 includes two spaced semi-circular protuberances 24 and 26 running the length of the extrusion 12. The protuberances 24 and 26 have centrally located therethrough, passageways 28 and 30.

The passageways 28 and 30 are extruded during the manufacture of the extrusion 12 and are formed with a plurality of facets 32 preferably equally spaced about the inner peripheral surface of the passageway 28 and extend the length thereof. By providing the multifaceted passageways 28 and 30, it is possible to obtain a greater heat conducting surface for fluid which will be supplied through the passageways 28 and 30.

The extrusion 12 is connected to a source of cooling fluid, preferably water, through flange couplings 34 and 36 connected to conduits 38 and 40 respectively. The couplings 34 and 36 are connected to the common end surface 42 of extrusion 12 and are coupled to the passageways 28 and 30 respectively. The other end surface 44 of extrustion 12 is provided with a U-shaped conduit 46 coupled by flanges 48 and 50 to the other end of the passageways 28 and 30, respectively. Accordingly, water supplied through conduit 38 will flow through passageway 28, U-shaped conduit 46, passageway 30, and out through conduit 40. It will thus be seen that the coolant (water) flowing through the heat sink will be operative to cool the heat sink 10 and conduct heat from any semiconductor mounted on the surface 14 of the extrusion 12. By utilizing the multifaceted passageways 28 and 30, it is possible to more efficiently conduct heat from the extrusion 12 and, thus, provide a more efficient heat sink for little additional cost in manufacture.

It will be seen that the major cost of this type of heat sink is the extrusion 12 and this extrusion can be manufactured in one process in a long strip type extrusion which can be cut to length as desired.

It will be understood in accordance with the teachings of the present invention, additional heat conductive fins could be added to the surface of the extrusion 12 in accordance with present teachings and, additionally, the number of facets in the passageways 28 and 32 can be varied within the scope of the teachings of the present invention.

It will be noted that the passageways 28 and 30 are parallel to the extrusion axis 52 of the extrusion 12. The extrusion axis is the axis along which the extrusion 12 was formed.

It will further be understood that the passageways 28 and 30 are generally star-shaped in cross-section so as to provide the desired facets to achieve the greater heat conduction for the reasons set forth above.

The present invention may be embodied in other specific forms without departing from the spirit or essential attributes thereof, and accordingly, reference should be made to the appended claims rather than to the foregoing specification as indicating the scope of the invention.

I claim as my invention:

1. A heat sink comprising a unitary main body, said main body being an extrusion of a heat conductive metal having a longitudinally extending extrusion axis, said main body having a mounting surface for mounting a semiconductor in heat conductive relation thereon, said main body having at least one passageway therethrough parallel to said extrusion axis, said passageway being uniformly star-shaped in cross-section and is defined by a plurality of facets extending the length of said main body parallel to said extrusion axis wherein said facets are equally spaced and are of equal depth and width, said passageway having at least five facets, whereby when a cooling fluid is supplied through said passageway, heat is more efficiently conducted away from said heat sink.

2. The heat sink of claim 1 wherein said main body includes a second passageway therethrough parallel to said first mentioned passageway and having the same cross-sectional area as said first mentioned passageway.

3. The heat sink of claim 2 including means for supplying fluid to said first and second passageways to cool said main body.

References Cited

UNITED STATES PATENTS

| | | | |
|---|---|---|---|
| 2,809,019 | 10/1957 | Newton | 165—179 X |
| 2,992,372 | 7/1961 | Himeon et al. | 317—234 |
| 3,167,926 | 2/1965 | Wepfer et al. | 62—3 X |
| 3,248,636 | 4/1966 | Colaiaco | 174—15 X |
| 3,275,921 | 9/1966 | Fellendorf et al. | 174—15 X |

FOREIGN PATENTS

| | | |
|---|---|---|
| 7,886 | 1902 | Great Britain. |

ROBERT A. O'LEARY, *Primary Examiner.*

A. W. DAVIS, *Assistant Examiner.*

U.S. Cl. X.R.

165—168, 177, 185; 317—100, 234